United States Patent [19]

Prechtl et al.

[11] Patent Number: 4,662,705
[45] Date of Patent: May 5, 1987

[54] PLUG-IN INSERTION SYSTEM FOR ELECTRICAL COMMUNICATIONS APPARATUS

[75] Inventors: Wolfgang Prechtl, Geretsried; Guenther Weis, Munich, both of Fed. Rep. of Germany

[73] Assignee: Siemens Aktiengesellschaft, Berlin and Munich, Fed. Rep. of Germany

[21] Appl. No.: 709,714

[22] Filed: Mar. 8, 1985

[30] Foreign Application Priority Data

Mar. 19, 1984 [DE] Fed. Rep. of Germany ....... 3410057

[51] Int. Cl.$^4$ .......................................... H01R 13/64
[52] U.S. Cl. .............................................. 339/184 R
[58] Field of Search .......... 339/186 R, 186 M, 184 R, 339/184 M

[56] References Cited

U.S. PATENT DOCUMENTS

| 2,928,998 | 3/1960 | Brumfield | 339/186 M |
| 3,007,150 | 10/1961 | Arrasmith | 339/184 M |
| 3,200,361 | 8/1965 | Schwartz et al. | 339/184 M |
| 3,287,031 | 9/1964 | Simmons | 339/186 R |
| 4,153,127 | 5/1979 | Klink et al. | 339/184 M |
| 4,478,469 | 10/1984 | Waite et al. | 339/184 M |
| 4,519,667 | 5/1985 | Canning et al. | 339/186 M |

FOREIGN PATENT DOCUMENTS

| 2455409 | 8/1976 | Fed. Rep. of Germany ... 339/186 M |
| 2541049 | 3/1977 | Fed. Rep. of Germany ... 339/186 M |
| 3323821 | 1/1985 | Fed. Rep. of Germany . |

Primary Examiner—Gil Weidenfeld
Assistant Examiner—Thomas M. Kline
Attorney, Agent, or Firm—Hill, Van Santen, Steadman & Simpson

[57] ABSTRACT

In the case of plug-in inserts for electrical communications apparatus for an unequivocal allocation of the insert relative to an insert receiving unit, a pin coding is provided in which several pins are arranged in a head portion of the insert. The pins on the insert are combined on common strips, and matching bores in the insert receiving unit can be closed off against faulty engagement of the pins through use of insertable pins or plugs.

5 Claims, 2 Drawing Figures

PLUG-IN INSERTION SYSTEM FOR ELECTRICAL COMMUNICATIONS APPARATUS

BACKGROUND OF THE INVENTION

The invention relates to a plug-in insert for electrical communications apparatus. In such apparatus, for mechanical allocation between an insert and an insert receiving unit, guide rails are provided, and for electrical contacting at the end of the insertion phase, electrical plug-in elements are provided. For unmistakable allocation of the two units relative to one another, identification pins are provided in the one unit, and matching openings are provided in the other unit which interengage prior to commencement of the electric contacting and prevent the contacting of a false unit.

A device of this type is described in greater detail in German Offenlegungsschrift 33 23 821, incorporated herein by reference. The coding pins which are capable of springy insertion on the insert on the one hand, and which are capable of springy insertion on the insert receiving unit on the other hand, are all designed to be equally long and, in the case of faulty coding, strike one another at a sufficient distance before the engagement of the electrical plug-in elements.

SUMMARY OF THE INVENTION

An object underlying the invention is to improve such a device in simple fashion.

In accordance with the invention, this object is achieved in that the pins on the insert are combined into common guide strips on both sides of the central mounting screw, which are capable of insertion in suitable openings in the head portion of the insert, and which are capable of being mounted by means of a pivot and a screw.

It is advantageously possible to mount complete code guide strips at the head of the insert exchangeably at any time so that a certain standardization results. Instead of equal-length coding pins, the coding pins combined on a guide strip are dimensioned to be somewhat longer, and instead the frame or suport side pins are shortened to plugs or pegs.

DESCRIPTION OF THE PREFERRED EMBODIMENTS

Figure 1:
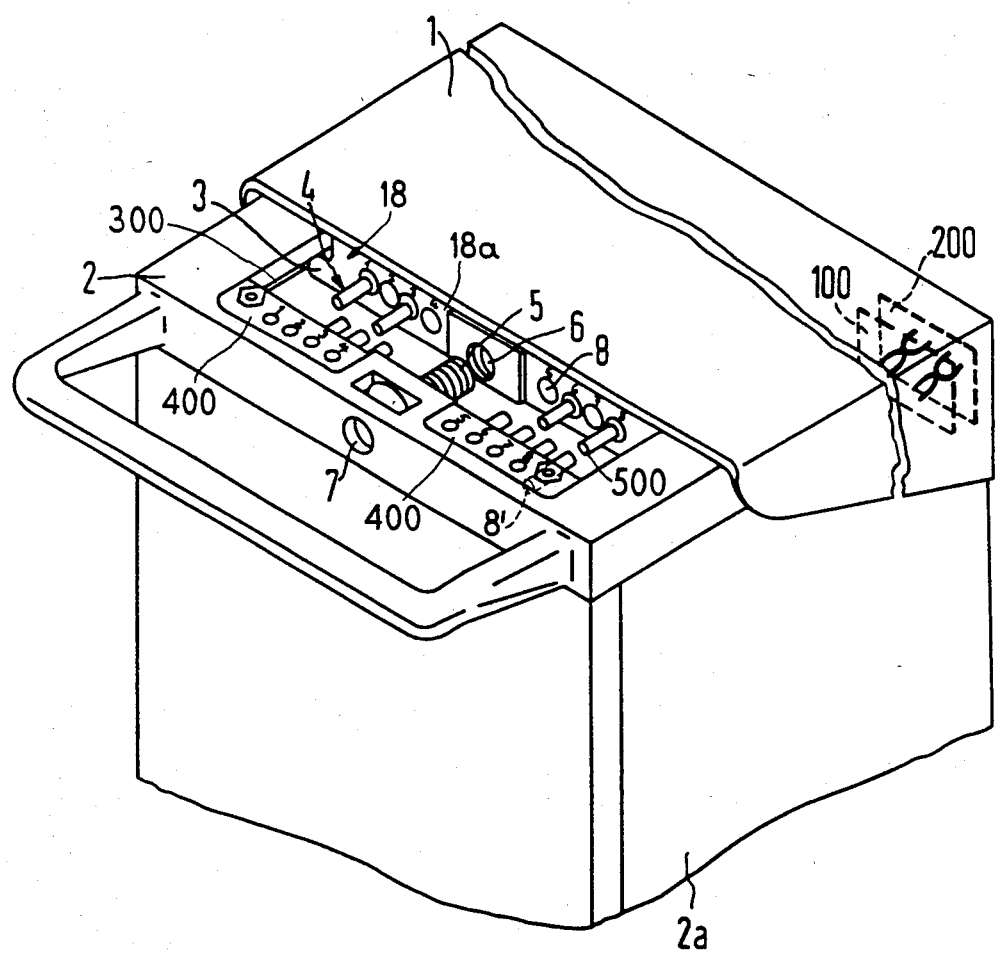
FIG. 1 shows the front portion of an insert with insert receiving unit in a system according to the invention.

In particular in the case of communications apparatus, a construction of the type illustrated in FIG. 1 is employed. An apparatus or insert receiving unit 1 is present at a frame-side which has guide rails 3 of guide frame 18 for corresponding guide channels 300 on an insert 2 including an electrical apparatus 2a. At the end of the insertion phase, plug-in elements 100, 200 arranged on the rear side inter-engage for the purpose of electrical contacting. For final mounting of such an insert, as is known, an assembly screw 5 is provided which engages into a corresponding engagement thread 6. The screw 5 is positioned directly in a frame-like support-mounting at an upper portion of the insert, and which can be accessed via an opening 7 for a screw driver. The insert comprises most frequently a vertically oblong housing, a so-called apparatus insert in which plug-in assemblies can be positioned.

Since it is desirable, in general, to establish a clear one matched correspondence between the insert and insert receiving unit, the following identification arrangement is provided therein. In the upper frontal region of the two units, an opening for identification pins 4 is provided. These identification pins are all similarly designed and can be selectively inserted in bores 8. In a facing surface 18a (second strip-like portion) of guide frame 18 of receiving unit 1 and in bores 8' in coding strip 400 (first strip-like portions) in insert 1. These bores 8 and 8' are preferably arranged in a row and, in any case, in such a fashion that the bores 8 of insert receiving unit 1 and bores 8' of insert 2 are positioned opposite one another in a matching fashion.

The identification pins 4 (more specifically shown in FIG. 2) are formed of a rear portion 16, having a diameter matched with the bores 8 and 8'. Portion 16 is preferably made springy through the provision of a slit 16a, so that pins 4 can be inserted in the bores 8 or 8' in a clamping fashion. A collet or collar 19 serves as the limit stop. The front portion 13 of the pins is slightly tapered in relation to the rear portion, so that the pin can readily engage in the respective oppositely disposed opening in the other part. Through a corresponding arrangement and number of pinss, a coding with respectively similar parts can now be carried out. Thus it is possible, for example, given ten bores and the use of two sets with each set containing five coding pins, to produce up to two hundred fifty-two different coding possibilities.

The coding can be recognized through labelling of the holes of the apparatus and the receiving unit with numbers or letters.

If the front sides 500 as shown in FIG. 1 of such pins strike one another, which signifies faulty coding, then it is not possible to conduct the electrical contacting 100 to the electrical contacting 200 of the insert (See FIG. 1) and its screw connection by means of screw 5 and thread 6 in the insert receiver unit 1. The length of the pins is correspondingly so dimensioned.

Preferably, the length of the coding pins is dimensioned to be somewhat larger than half the projecting winding 6 of the assembly screw 5. In this fashion, a damage due to forceful screwing-on of the insert is prevented.

Only correctly coded inserts can be screwed on in the insert receiving unit and electrically contacted. In the normal instance, the pins then do not strike one another, but engage in the corresponding bores on the respective counter side.

The coding can be readily changed not only during manufacture, but at any time, since, for this purpose, the pins, which can be removed relatively simply, are alterable in their position, and exchangeable.

The advantage of like coding pins is that only one coding part is required, and the necessary pin length—as well as installation space—is cut in half. Also, the possible inclination of the pins and the necessary dimensions of the bores become less critical, i.e. can be kept smaller.

Figure 2:
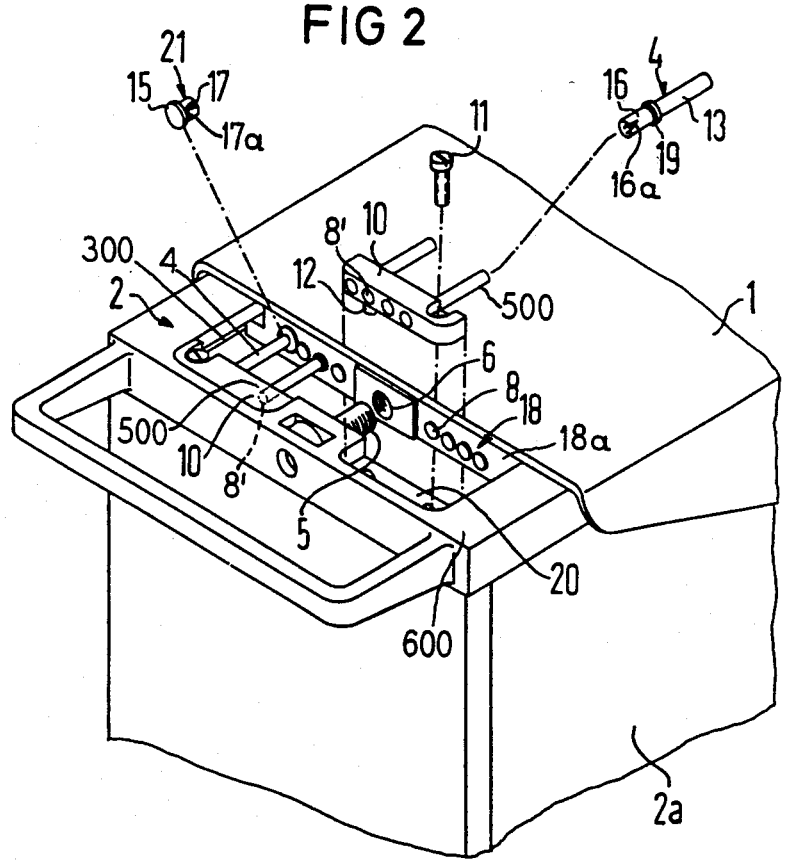
FIG. 2 shows an improvement of the system shown in FIG. 1 wherein coding plugs are provided in addition to coding pins, and wherein coding strips are received in locating recesses.

In FIG. 2, the improvement of this device is shown. Coding strips 10 at the inserts and at the insert receiving unit are inserted in the recesses 20 of a guide 600 on both sides of the assembly screw 5 for the insert 2. Bores 8 matched to the pins 4 are provided in front of and in alignment with the pins 4 adjacent the thread 6 in the facing surface 18a (strip-like portion) of guide frame 18 of the insert receiving unit 1.

The coding strips 10, fabricated for example from aluminum pressure die casting or plastic, are designed so that they can be inserted in a recess 20 portion of the insert and can be mounted with one screw 11 each. A mounting pin 12, cast on the coding strip, prevents a twisting or rotation of the strips, and hence an undesired inclination of the coding pins 4.

Coding pins 4 are inserted in the bores 8' (or 8) on the insert 2 with the apparatus 2a, and coding plugs 21 are inserted in the bores 8 (or 8') on the receiving unit 1 side. Plugs 21 have a collar 15 as a limit stop upon insertion in the facing surface 18a (second strip-like portion).

The length of the identification coding, strips or pins 4 is determined by the assembly screw 5 of the insert 2, i.e. the pins 4 are dimensioned such that the assembly screw, in the case of faulty coding, is not yet permitted to engage in the receiving unit side thread when an end 500 abuts a plug 15 in order to prevent damage to the device through forceful screw fastening.

The coding pins 4 have a collar 19 and insertion portion 16 with slits 16a and the coding plugs 21 respectively have a collar 15 and an insertion portion 17 with slit 17a dimensioned so as to match the bores 8 (or 8') in diameter, so that they can be inserted in the bores 8 (or 8') in a clamping fashion. The insertion can proceed manually or by means of an instrument. A multiple exchange of the pins and plugs is possible. Only correctly coded inserts can be screwed on and electrically contacted. In the normal instance, the apparatus-side pins 4 and the receiving-side plugs 21 do not then strike one another. Rather, the pins engage in the corresponding bores in the guide frame 18 of the receiver unit 1.

However, it is also possible, as shown in FIG. 1, to employ at the insert 2 side and at the receiving unit 1 side the coding pins 4 illustrated therein, and having about one half the length as shown in FIG. 2. Thus, the coding plugs 21 can be dispensed with. Also, a combination of both types can be employed.

In this fashion, different customer demands can be satisfied without great expense by means of a retrofit set. This is, in particular, advantageous also for digital technology, recently increasingly employed, with various required supply voltages.

Although various minor changes and modifications might be proposed by those skilled in the art, it will be understood that we wish to include within the claims of the patent warranted hereon all such changes and modifications as reasonably come within our contribution to the art.

We claim as our invention:

1. A plug-in insert system for electrical communication apparatus, comprising:
    an insert having an electrical apparatus associated therewith and an insert receiving unit having guide rails engageable with a guide means of the insert, the insert receiving unit being dimensioned to receive the insert;
    first and second electrical contacting element means on the insert and receiving unit respectively for electrical contact engagement therebetween upon insertion of the insert in the insert receiving unit;
    means for unmistakable allocation of a proper insert with a corresponding insert receiving unit, said means including identification pins and matching corresponding bores allocated to the insert and receiving unit, the pins having a sufficient length such that if a corresponding bore is blocked off, electrical contact will not occur between the first and second electrical contacting element means, and if a corresponding bore is not blocked off, the identification pins will engage in the matching bores upon complete insertion and the first and second contacting element means will establish contact;
    the matching corresponding bores being formed in respective coding strips mountable on the insert and also in a facing surface of the insert receiving unit at a frontal region of each, and each coding strip mounted on the insert having means for alignment and attachment thereof at the frontal region of the insert;
    all of the bores in the coding strips and in the facing surface having a same diameter;
    the identification pins having a rear-side portion which is slit so as to permit a press fit of the pin when it is received in a respective bore for mounting, each pin also having a front portion which is tapered and a collar between the front portion and read-side portion, said collar serving as a stop upon insertion of the rear-side portion into the respective bore;
    recess means provided in the insert for receiving said coding strips;
    a central assembly screw means for securing the insert and insert receiving unit together; and
    at least one of said coding strips being provided on each side of the central assembly screw means on the insert.

2. An insert system according to claim 1 wherein in addition to said pins, plugs are also provided which are dimensioned to be receivable in one or more of said bores so as to close off one or more of said bores and prevent engagement of an identification pin front-portion in the corresponding bore with which it is aligned, said plugs having a slit insertion portion and a collar.

3. An insert system according to claim 1 wherein the front portion of the identification pins has a length sufficient to prevent engagement of a central assembly screw which is mounted on the insert with corresponding threads mounted on the insert receiving unit when the identification pin is blocked off from entering a corresponding bore.

4. An insert system according to claim 1 wherein in order to prevent engagement of an identification pin front portion into the corresponding bore an identical further identification pin has its rear portion inserted in the corresponding bore so that the two identification pin front portion leading ends will abut against one another.

5. An insert system according to claim 4 wherein a total length of the two abutting identification pin front portions is sufficiently long so as to prevent engagement between a central assembly screw and threads of the insertion receiving unit.

* * * * *